(12) United States Patent
Wang et al.

(10) Patent No.: US 11,611,353 B2
(45) Date of Patent: Mar. 21, 2023

(54) QUANTIZER FOR SIGMA-DELTA MODULATOR, SIGMA-DELTA MODULATOR, AND NOISE-SHAPED METHOD

(71) Applicant: INSTITUTE OF MICROELECTRONICS, CHINESE ACADEMY OF SCIENCES, Beijing (CN)

(72) Inventors: Kunyu Wang, Beijing (CN); Li Zhou, Beijing (CN); Jie Chen, Beijing (CN); Minghui Chen, Beijing (CN); Ming Chen, Beijing (CN); Wenjing Xu, Beijing (CN); Chengbin Zhang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 146 days.

(21) Appl. No.: 17/422,050

(22) PCT Filed: Jun. 4, 2021

(86) PCT No.: PCT/CN2021/098441
§ 371 (c)(1),
(2) Date: Jul. 9, 2021

(87) PCT Pub. No.: WO2022/252229
PCT Pub. Date: Dec. 8, 2022

(65) Prior Publication Data
US 2022/0416808 A1   Dec. 29, 2022

(51) Int. Cl.
*H03M 3/00*   (2006.01)
(52) U.S. Cl.
CPC ........... *H03M 3/344* (2013.01); *H03M 3/424* (2013.01); *H03M 3/464* (2013.01)
(58) Field of Classification Search
CPC ....... H03M 3/344; H03M 3/424; H03M 3/464
(Continued)

(56) References Cited

U.S. PATENT DOCUMENTS 5,148,167 A * 9/1992 Ribner ................. H03M 3/414
341/172
5,327,137 A * 7/1994 Scheerer ................. H03M 1/50
341/166

(Continued)

*Primary Examiner* — Jean B Jeanglaude
(74) *Attorney, Agent, or Firm* — Christensen, Fonder, Dardi & Herbert PLLC

(57) ABSTRACT

A quantizer for a sigma-delta modulator, a sigma-delta modulator, and a method of shaping noise are provided. The quantizer includes: an integrator configured to generate, in a $K^{th}$ sampling period, a quantization error signal for a $K^{th}$ period according to an internal signal, a quantization error signal for a $(K-1)^{th}$ period, a filtered quantization error signal for the $(K-1)^{th}$ period and a filtered quantization error signal for a $(K-2)^{th}$ period; an integrating capacitor configured to store the quantization error signal for the $K^{th}$ period, to weight the internal signal in a $(K+1)^{th}$ sampling period; a passive low-pass filter configured to acquire the quantization error signal for the $K^{th}$ period in a $K^{th}$ discharge period, and feed back the filtered quantization error signal to the integrator in a $(K+1)^{th}$ sampling period and a $(K+2)^{th}$ sampling period; and a comparator configured to quantize the quantization error signal for the $K^{th}$ period.

14 Claims, 8 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 7,894,536 B2* | 2/2011 | Risbo | ................... | H03M 3/388 |
| | | | | 375/243 |
| 8,305,246 B2* | 11/2012 | Kinyua | ................... | H03F 3/217 |
| | | | | 341/150 |
| 9,419,643 B2* | 8/2016 | Watanabe | ............. | H03M 3/472 |
| 9,780,798 B1* | 10/2017 | Das | ......................... | H03M 1/48 |
| 2012/0213531 A1* | 8/2012 | Nazarathy | ................. | G02F 7/00 |
| | | | | 398/202 |
| 2016/0149585 A1* | 5/2016 | Watanabe | ............. | H03M 3/464 |
| | | | | 341/143 |
| 2019/0379392 A1* | 12/2019 | Miyahara | .............. | H03M 3/396 |

* cited by examiner

900

---

In a $K^{th}$ sampling period, an internal signal, a quantization error signal for a $(K-1)^{th}$ period stored on an integrating capacitor, a filtered quantization error signal for the $(K-1)^{th}$ period fed back by a passive low-pass filter, and a filtered quantization error signal for a $(K-2)^{th}$ period fed back by the passive low-pass filter are acquired by an integrator, and a quantization error signal for a $K^{th}$ period is generated accordingly. The quantization error signal for the $K^{th}$ period is stored on the integrating capacitor ⎯ S910

In a $K^{th}$ discharge period, the quantization error signal for the $K^{th}$ period is acquired by the passive low-pass filter, and a filtered quantization error signal is generated accordingly, so as to feed back the filtered quantization error signal to the integrator in a $(K+1)^{th}$ sampling period and a $(K+2)^{th}$ sampling period ⎯ S920

In the $K^{th}$ discharge period, the quantization error signal for the $K^{th}$ period is quantized by a comparator, so as to output a digital code ⎯ S930

QUANTIZER FOR SIGMA-DELTA MODULATOR, SIGMA-DELTA MODULATOR, AND NOISE-SHAPED METHOD

CROSS REFERENCE TO RELATED APPLICATION(S)

The present disclosure is a Section 371 National Stage Application of International Application No. PCT/CN2021/098441, filed on Jun. 4, 2021, entitled "QUANTIZER FOR SIGMA-DELTA MODULATOR, SIGMA-DELTA MODULATOR, AND NOISE-SHAPED METHOD".

TECHNICAL FIELD

The present disclosure relates to a field of electricity, and in particular to a quantizer for a sigma-delta modulator, a sigma-delta modulator, and a noise-shaped method.

BACKGROUND

In a conventional sigma-delta modulator, a plurality of analog integrators cascaded are generally used to achieve a high-order suppression of a quantization noise, so as to reduce power of the quantization noise and improve a signal-to-noise ratio thereof. However, with an increase of a number of the analog integrators, stability of a loop may gradually deteriorate, and power consumption of a system may further increase.

In a related art, in order to reduce the power consumption of the sigma-delta modulator and ensure the stability of the loop, a quantizer with a noise shaping function is usually introduced into the sigma-delta modulator. However, the sigma-delta modulator described above is difficult to achieve high-order noise shaping with low power consumption.

SUMMARY

The present disclosure provides a quantizer for a sigma-delta modulator, a sigma-delta modulator, and a method of shaping noise.

According to an aspect of the present disclosure, there is provided a quantizer for a sigma-delta modulator, including: an integrator configured to generate a quantization error signal for a $K^{th}$ period in a $K^{th}$ sampling period according to an internal signal, a quantization error signal for a $(K-1)^{th}$ period, a filtered quantization error signal for the $(K-1)^{th}$ period, and a filtered quantization error signal for a $(K-2)^{th}$ period, where K is a positive integer greater than 1; an integrating capacitor configured to store the quantization error signal for the $K^{th}$ period, so as to weight the internal signal in a $(K+1)^{th}$ sampling period; a passive low-pass filter configured to acquire the quantization error signal for the $K^{th}$ period in a $K^{th}$ discharge period, generate a filtered quantization error signal according to the quantization error signal, and feedback the filtered quantization error signal to the integrator in a $(K+1)^{th}$ sampling period and a $(K+2)^{th}$ sampling period; and a comparator configured to quantize the quantization error signal for the $K^{th}$ period in the $K^{th}$ discharge period, so as to output a digital code.

Preferably, the passive low-pass filter includes a first passive low-pass filter and a second passive low-pass filter, the first passive low-pass filter is coupled to a positive phase input port and a positive phase output port of the integrator; the second passive low-pass filter is coupled to a negative phase input port and a negative phase output port of the integrator, and each of the first passive low-pass filter and the second passive low-pass filter includes: a first capacitor configured to acquire the quantization error signal for the $K^{th}$ period in the $K^{th}$ discharge period, generate the filtered quantization error signal according to the quantization error signal, and feedback the filtered quantization error signal to the integrator in the $(K+1)^{th}$ sampling period; and a second capacitor and a third capacitor configured to respectively acquire a quantization error signal for an odd-numbered period and a quantization error signal for an even-numbered period, generate the filtered quantization error signals according to the quantization error signal for the odd-numbered period and the quantization error signal for the even-numbered period, and feedback the filtered quantization error signals to the integrator in the $(K+2)^{th}$ sampling period.

According to another aspect of the present disclosure, there is provided a sigma-delta modulator, including: the quantizer described above; and a front part including a front input port for receiving an input signal and a front output port for outputting an internal signal, wherein the front part is configured to generate the internal signal according to the input signal.

Preferably, the front part includes a first analog integrator, a second analog integrator, and a second digital-to-analog converter; the second digital-to-analog converter is coupled between an output port of the quantizer and a second feedback port of the first analog integrator as well as a third feedback port of the second analog integrator, and is configured to convert the digital code output by the quantizer, and provide a second feedback signal according to the digital code; the first analog integrator is configured to receive the input signal and the second feedback signal, and generate a first integrated signal according to the input signal and the second feedback signal; and the second analog integrator is configured to receive the input signal, the second feedback signal and the first integrated signal, and generate the internal signal according to the input signal, the second feedback signal and the first integrated signal.

Preferably, the front part further includes a first digital-to-analog converter configured to convert the digital code output by the quantizer and provide a first feedback signal; the quantizer further includes a first feedback port coupled to a positive input port of the integrator, a negative input port of the integrator, and an output port of the first digital-to-analog converter, and configured to receive the first feedback signal; the integrator is further configured to integrate the internal signal according to the first feedback signal.

Preferably, the sigma-delta modulator further includes a digital integrator coupled to the output port of the quantizer, and configured to integrate the digital code output by the quantizer so as to provide an integrated digital code.

Preferably, the front part includes a first analog integrator, a second analog integrator, and a second digital-to-analog converter, the second digital-to-analog converter is coupled between an output port of the digital integrator and a second feedback port of the first analog integrator as well as a third feedback port of the second analog integrator, and is configured to convert the digital code output by the digital integrator and provide a second feedback signal according to the digital code; the first analog integrator is configured to receive the input signal and the second feedback signal, and generate a first integrated signal according to the input signal and the second feedback signal; the second analog integrator further includes a fourth feedback port coupled to an output port of the first digital-to-analog converter and configured to receive the first feedback signal, and the second analog integrator is further configured to generate the internal signal according to the input signal, the first integrated signal, the second feedback signal, and the first feedback signal.

Preferably, the first analog integrator includes: a fourth capacitor and a fifth capacitor configured to acquire the input signal and the second feedback signal and store a difference between the input signal and the second feedback signal; and a sixth capacitor and a seventh capacitor configured to receive the difference between the input signal and the second feedback signal and generate the first integrated signal according to the difference between the input signal and the second feedback signal.

Preferably, the second analog integrator includes: an eighth capacitor and a ninth capacitor configured to acquire and store the first integrated signal; a tenth capacitor and an eleventh capacitor configured to acquire the input signal and the second feedback signal, and store a difference between the input signal and the second feedback signal; a twelfth capacitor and a thirteenth capacitor configured to receive the first integrated signal and the difference between the input signal and the second feedback signal, and generate the internal signal according to the first integrated signal and the difference between the input signal and the second feedback signal.

Preferably, the second analog integrator includes: an eighth capacitor and a ninth capacitor configured to acquire the first integrated signal and the first feedback signal, and store a difference between the first integrated signal and the first feedback signal; a tenth capacitor and an eleventh capacitor configured to acquire the input signal and the second feedback signal, and store a difference between the input signal and the second feedback signal; a twelfth capacitor and a thirteenth capacitor configured to receive the difference between the first integrated signal and the first feedback signal and the difference between the input signal and the second feedback signal, and generate the internal signal according to the difference between the first integrated signal and the first feedback signal and the difference between the input signal and the second feedback signal.

According to another aspect of the present disclosure, there is provided a method of shaping noise, including: acquiring, by using an integrator in a $K^{th}$ sampling period, an internal signal, a quantization error signal for a $(K-1)^{th}$ period stored on an integrating capacitor, a filtered quantization error signal for the $(K-1)^{th}$ period fed back by a passive low-pass filter and a filtered quantization error signal for a $(K-2)^{th}$ period fed back by the passive low-pass filter, and generating a quantization error signal for a $K^{th}$ period accordingly, wherein the quantization error signal for the $K^{th}$ period is stored on the integrating capacitor, so as to weight the internal signal in a $(K+1)^{th}$ sampling period, where K is a positive integer greater than 1; acquiring, by using the passive low-pass filter in a $K^{th}$ discharge period, the quantization error signal for the $K^{th}$ period, and generating a filtered quantization error signal according to the quantization error signal, so as to feed back the filtered quantization error signal to the integrator in a $(K+1)^{th}$ sampling period and a $(K+2)^{th}$ sampling period; and quantizing the quantization error signal for the $K^{th}$ period by using a comparator, so as to output a digital code.

Preferably, the acquiring, by using the passive low-pass filter in a $K^{th}$ discharge period, the quantization error signal for the $K^{th}$ period, and generating a filtered quantization error signal, so as to feed back the filtered quantization error signal to the integrator in a $(K+1)^{th}$ sampling period and a $(K+2)^{th}$ sampling period includes: acquiring the quantization error signal for the $K^{th}$ period by using a first capacitor, generating a filtered quantization error signal according to the quantization error signal, and feeding back the filtered quantization error signal to the integrator in the $(K+1)^{th}$ sampling period; and acquiring a quantization error signal for an odd-numbered period and a quantization error signal for an even-numbered period respectively by a second capacitor and a third capacitor, generating the filtered quantization error signals according to the quantization error signal for the odd-numbered period and the quantization error signal for the even-numbered period, and feeding back the filtered quantization error signals to the integrator in the $(K+2)^{th}$ sampling period.

BRIEF DESCRIPTION OF THE DRAWINGS

The accompanying drawings are used to better understand the present disclosure and do not constitute a limitation to the present disclosure, in which:

FIG. 9 shows a flowchart of a method of shaping noise according to the embodiments of the present disclosure.

DETAILED DESCRIPTION OF EMBODIMENTS

In order to make objectives, technical solutions and advantages of the present disclosure clearer, the present disclosure will be further described in detail below in combination with specific embodiments and with reference to the drawings.

Figure 1A:
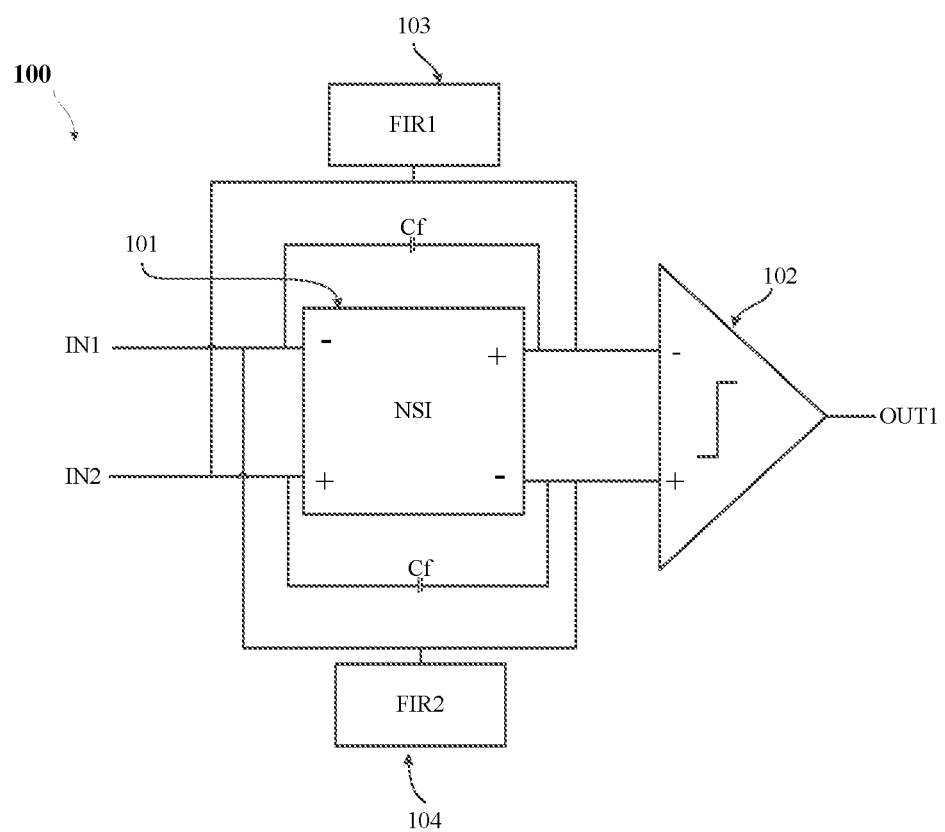
FIG. 1A and FIG. 1B show schematic structural diagrams of a quantizer for a sigma-delta modulator according to the embodiments of the present disclosure.

FIG. 1A shows a schematic structural diagram of a quantizer for a sigma-delta modulator according to the embodiments of the present disclosure.

As shown in FIG. 1A, the quantizer for the sigma-delta modulator specifically includes: signal input terminals IN1 and IN2, an integrator 101, a comparator 102, two integrating capacitors Cf, a first passive low-pass filter 103, a second passive low-pass filter 104, and a signal output terminal OUT1.

The signal input terminals IN1 and IN2 are used to acquire an internal signal in a $K^{th}$ sampling period.

In the embodiments of the present disclosure, the internal signal is specifically generated by a front part of the sigma-delta modulator according to an input signal. Specifically, the front part may perform, for example, a first-order noise shaping on the input signal so as to generate the internal signal. This will be explained in detail later.

The integrator 101 has a negative phase input port and a positive phase input port that are, for example, respectively coupled to the signal input terminals IN1 and IN2, and further has a positive phase output port and a negative phase output port that are, for example, respectively coupled to a negative phase input port and a positive phase input port of the comparator 102. The integrator 101 is used to generate a quantization error signal for a $K^{th}$ period in a $K^{th}$ sampling period according to an internal signal, a quantization error signal for a $(K-1)^{th}$ period, a filtered quantization error signal for the $(K-1)^{th}$ period, and a filtered quantization error signal for a $(K-2)^{th}$ period, where K is a positive integer greater than 1.

Both integrating capacitors Cf are coupled to the integrator 101 and are used to store the quantization error signal for the $K^{th}$ period, so as to weight the internal signal in a $(K+1)^{th}$ sampling period.

The first passive low-pass filter 103 has an input port and an output port that are, for example, respectively coupled to the positive phase output port and the positive phase input port of the integrator 101. The second passive low-pass filter 104 has an input port and an output port that are, for example, respectively coupled to the negative phase output port and the negative phase input port of the integrator 101. The first passive low-pass filter 103 and the second passive low-pass filter 104 are used to acquire the quantization error signal for the $K^{th}$ period in a $K^{th}$ discharge period, generate a filtered quantization error signal according to the quantization error signal, and feedback the filtered quantization error signal to the integrator in a $(K+1)^{th}$ sampling period and a $(K+2)^{th}$ sampling period.

The comparator 102 is connected to the signal output terminal OUT1, and is used to quantize the quantization error signal for the $K^{th}$ period in the $K^{th}$ discharge period, output a digital code, and provide a discharge time for the discharge period. The digital code output by the comparator 102 is externally output through the signal output terminal OUT1.

In the embodiments of the present disclosure, a specific operation process of the quantizer is as follows. In the $K^{th}$ sampling period, the internal signal is input to the quantizer through the signal input terminals IN1 and IN2. At the same time, the first passive low-pass filter 103 and the second passive low-pass filter 104 respectively feed back the filtered quantization error signal for the $(K-1)^{th}$ period and the filtered quantization error signal for the $(K-2)^{th}$ period to an input terminal of the quantizer, and the filtered quantization error signals are superimposed with the internal signal. The above three signals are superimposed with the quantization error signal for the $(K-1)^{th}$ period stored on the integrating capacitors Cf through the integrator 101, so as to generate the quantization error signal for the $K^{th}$ period. The integrating capacitors Cf may store the quantization error signal for the $K^{th}$ period, so as to weight, in the $(K+1)^{th}$ sampling period, the internal signal acquired by the input terminals IN1 and IN2 and the filtered quantization error signals fed back by the first passive low-pass filter 103 and the second passive low-pass filter 104 to the input terminal of the quantizer.

In the $K^{th}$ discharge period, the comparator 102 may quantize the quantization error signal for the $K^{th}$ period, and at the same time the integrating capacitors Cf start to discharge. When the comparator 102 detects that a magnitude relationship between levels at the output ports of the integrator 101 is reversed, the discharging of the integrating capacitors Cf ends, and the quantization also ends. A comparison period prior to a reversal detected by the comparator 102 is taken as an output result of the quantizer. Then, the comparator 102 may quantize the error and output the digital code through the signal output terminal OUT1. In some embodiments, the integrating capacitors Cf may be recharged for half the comparison period in a last half period of a clock of the comparator 102, so that the quantization error signal on the integrating capacitors Cf may be reduced to half of the original one, and a better noise shaping effect may be achieved.

In the $K^{th}$ discharge period described above, the first passive low-pass filter 103 and the second passive low-pass filter 104 may respectively acquire the quantization error signal for the $K^{th}$ period stored on the integrating capacitors Cf, generate the filtered quantization error signal according to the quantization error signal, and feedback the filtered quantization error signal to the integrator 101 in the $(K+1)^{th}$ sampling period and the $(K+2)^{th}$ sampling period.

Figure 1B:
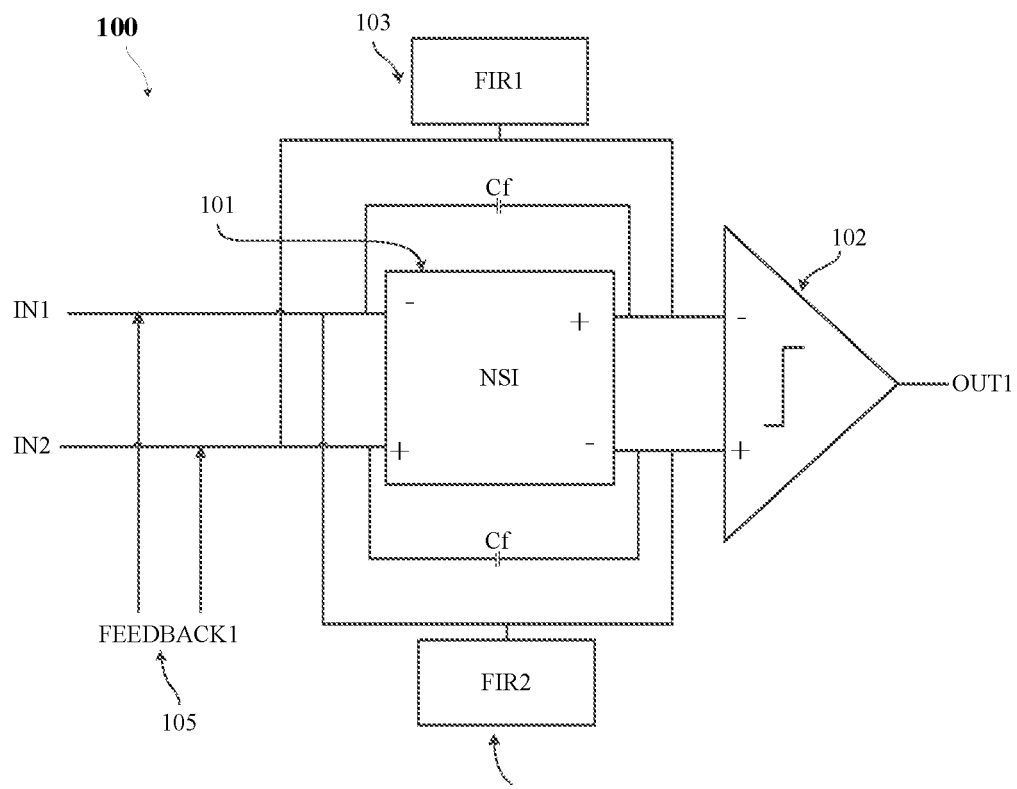

FIG. 1B shows a schematic structural diagram of a quantizer for a sigma-delta modulator according to the embodiments of the present disclosure.

As shown in FIG. 1B, the quantizer for the sigma-delta modulator specifically includes: signal input terminals IN1 and IN2, an integrator 101, a comparator 102, two integrating capacitors Cf, a first passive low-pass filter 103, a second passive low-pass filter 104, a first feedback port 105, and a signal output terminal OUT1. The signal input terminals IN1 and IN2, the integrator 101, the comparator 102, the integrating capacitors Cf, the first passive low-pass filter 103, the second passive low-pass filter 104 and the signal output terminal OUT1 have the same or similar functions as those described above, which will not be repeated here.

In the embodiments of the present disclosure, the first feedback port 105 is coupled to the positive input port and the negative input port of the integrator 101. The first feedback port 105 is used to receive, in the $K^{th}$ sampling period, a first feedback signal fed back by the front part, and feedback the first feedback signal to the integrator 101. The integrator 101 may integrate the internal signal according to the first feedback signal.

The integrator 101 may generate the quantization error signal for the $K^{th}$ period in the $K^{th}$ sampling period according to the internal signal, the first feedback signal, the quantization error signal for the $(K-1)^{th}$ period, the filtered quantization error signal for the $(K-1)^{th}$ period, and the filtered quantization error signal for the $(K-2)^{th}$ period. The process is similar to that described above, which will not be repeated here.

In some embodiments of the present disclosure, the first passive low-pass filter and the second passive low-pass filter include a first capacitor, a second capacitor, and a third capacitor. The first capacitor is used to acquire the quantization error signal for the $K^{th}$ period in the $K^{th}$ discharge period, generate the filtered quantization error signal according to the quantization error signal, and feedback the filtered quantization error signal to the integrator in the $(K+1)^{th}$ sampling period. The second capacitor and the third capacitor are used to respectively acquire a quantization error signal for an odd-numbered period and a quantization error signal for an even-numbered period, generate the filtered quantization error signals accordingly, and feedback the filtered quantization error signals to the integrator in the $(K+2)^{th}$ sampling period.

In the embodiments of the present disclosure, the first passive low-pass filter 103 and the second passive low-pass filter 104 each may include, for example, a first capacitor, a second capacitor, and a third capacitor (not shown in FIG. 1). The first capacitor is used to acquire, in the $K^{th}$ discharge period, the quantization error signal for the $K^{th}$ period, generate the filtered quantization error signal according to the quantization error signal, and feedback the filtered quantization error signal to the integrator in the $(K+1)^{th}$ sampling period. The second capacitor and the third capacitor are used to respectively acquire a quantization error signal for an odd-numbered period and a quantization error signal for an even-numbered period, generate the filtered quantization error signals accordingly, and feedback the filtered quantization error signals to the integrator in the $(K+2)^{th}$ sampling period. With the feedback method described above, the quantization error signals may be fed back to the input terminal of the quantizer. That is, the first capacitor is used to directly feedback the filtered quantization error signal to the input terminal of the quantizer in a next sampling period so as to superimpose the filtered quantization error signal on the internal signal input, and the second capacitor or the third capacitor is used to feed back the quantization error signal to the input terminal of the quantizer after a period of delay so as to superimpose the filtered quantization error signal on the internal signal input. The three paths operate together to form a passive low-pass filter of a transfer function $H(z)=1-z^{-1}$, so that the entire quantizer has a capability of second-order noise shaping.

The capability of second-order noise shaping of the quantizer in the embodiments of the present disclosure will be described below.

For example, in the $K^{th}$ period, suppose a digital signal output by the quantizer is $D(z)$, the input signal of the sigma-delta modulator is $X(z)$ (the front part of the sigma-delta modulator may generate the internal signal according to the input signal), and the quantization error signal introduced in the $K^{th}$ period after the quantization by the comparator 102 is $eq(z)$. A relationship between the digital signal $D(z)$ output by the quantizer and the input signal $X(z)$ may satisfy Equation (1).

$$D(z)=X(z)-(1-z^{-1})z^{-1}eq(z)-z^{-1}eq(z)+eq(z) \quad (1)$$

In Equation (1), $D(z)$ indicates the digital signal output by the quantizer in the $K^{th}$ period, $X(z)$ indicates the input signal of the sigma-delta modulator in the $K^{th}$ period, $(1-z^{-1})z^{-1}eq(z)$ indicates a sum of the filtered quantization error signal for the $(K-1)^{th}$ period and the filtered quantization error signal for the $(K-2)^{th}$ period fed back by the passive low-pass filters, $z^{-1}eq(z)$ indicates the quantization error signal for the $(K-1)^{th}$ period stored on the integrating capacitors, and $eq(z)$ indicates the quantization error signal introduced in the $K^{th}$ period after the quantization by the comparator 102.

Equation (2) may be further obtained from Equation (1).

$$D(z)=X(z)+(1-z^{-1})^2 eq(z) \quad (2)$$

According to Equation (2), the quantizer in the embodiments of the present disclosure may feed back the quantization error signal to the input terminal of the quantizer by using a passive low-pass filter structure, so as to perform the second-order noise shaping. Since the passive low-pass filter is composed of passive components and a sampling signal thereof is the output signal of the quantizer in the discharge period (that is, the quantization error signal), it does not consume additional energy. Therefore, the quantizer in the present disclosure may not cause a significant increase in the power consumption of the system while improving the noise shaping capability of the system. The passive low-pass filter consumes almost no energy and may be more energy-efficient when the modulator has the same quantization effective number of bits, so that a problem of large power consumption in a conventional second-order noise shaping integral quantizer may be effectively solved.

The embodiments of the present disclosure provide a sigma-delta modulator, including a quantizer and a front part. The front part includes a front input port for receiving an input signal and a front output port for outputting an internal signal. The front part is used to generate the internal signal according to the input signal. The quantizer in the sigma-delta modulator is the same as or similar to that described above in a structure and an operation process, which will not be repeated here.

In the embodiments of the present disclosure, the quantizer includes an integrator, an integrating capacitor, a passive low-pass filter, and a comparator.

The integrator is used to generate, in the $K^{th}$ sampling period, a quantization error signal for the $K^{th}$ period according to an internal signal, a quantization error signal for the $(K-1)^{th}$ period, a filtered quantization error signal for the $(K-1)^{th}$ period, and a filtered quantization error signal for the $(K-2)^{th}$ period, where K is a positive integer greater than 1.

The integrating capacitor is used to store the quantization error signal for the $K^{th}$ period, so as to weight the internal signal in the $(K+1)^{th}$ sampling period.

The passive low-pass filter is used to acquire the quantization error signal for the $K^{th}$ period in the $K^{th}$ discharge period, generate the filtered quantization error signal according to the quantization error signal, and feedback the filtered quantization error signal to the integrator in the $(K+1)^{th}$ sampling period and the $(K+2)^{th}$ sampling period.

The comparator is used to quantize the quantization error signal for the $K^{th}$ period in the $K^{th}$ discharge period, so as to output the digital code.

In some embodiments, the passive low-pass filter includes a first passive low-pass filter and a second passive low-pass filter. The first passive low-pass filter is coupled to the positive phase input port and the positive phase output port of the integrator. The second passive low-pass filter is coupled to the negative phase input port and the negative phase output port of the integrator. The first passive low-pass filter and the second passive low-pass filter may include a first capacitor, a second capacitor, and a third capacitor. The first capacitor is used to acquire a quantization error signal for the $K^{th}$ period in the $K^{th}$ discharge period, generate the filtered quantization error signal according to the quantization error signal, and feedback the filtered quantization error signal to the integrator in the $(K+1)^{th}$ sampling period. The second capacitor and the third capacitor are used to respectively acquire a quantization error signal for the odd-numbered period and a quantization error signal for the even-numbered period, generate the filtered quantization error signals accordingly, and feedback the filtered quantization error signals to the integrator in the $(K+2)^{th}$ sampling period. With the passive low-pass filter structure, the quantization error signal acquired in the discharge period may be fed back to the input terminal of the quantizer, so as to form the passive low-pass filter of the transfer function $H(z)=1-z^{-1}$, so that the entire quantizer has the capability of second-order noise shaping.

The quantizer in the embodiments of the present disclosure may feedback the quantization error signal acquired in the discharge period to the input terminal of the quantizer by using the passive low-pass filter structure, so as to achieve the second-order noise shaping. Since the passive low-pass filter is composed of passive components and a sampling signal thereof is the output signal of the quantizer in the discharge period (that is, the quantization error signal), it does not consume additional energy. Therefore, the quantizer in the present disclosure may not cause a significant increase in the power consumption of the system while improving the noise shaping capability of the system. The passive low-pass filter consumes almost no energy and may be more energy-efficient when the sigma-delta modulator has the same quantization effective number of bits, so that the power consumption of the quantizer may be effectively reduced, and the power consumption of the sigma-delta modulator may be further reduced.

Figure 2:
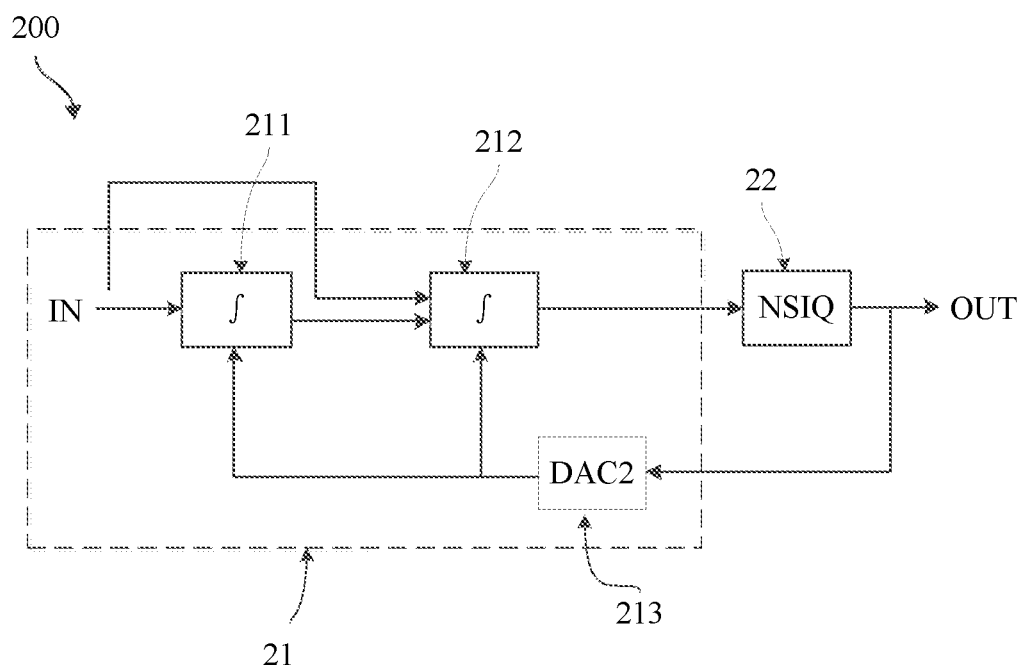
FIG. 2 shows a schematic structural diagram of a sigma-delta modulator according to the embodiments of the present disclosure.

FIG. 2 shows a schematic structural diagram of a sigma-delta modulator according to the embodiments of the present disclosure.

As shown in FIG. 2, the sigma-delta modulator includes a front part 21, a quantizer 22, and a signal output port OUT. The quantizer 22 includes an integrator, an integrating capacitor, a passive low-pass filter, and a comparator. The integrator, the integrating capacitor, the passive low-pass filter and the comparator are the same as or similar to those described above in the structure and the operation process, which will not be repeated here.

The front part 21 includes a signal input port IN, a first analog integrator 211, a second analog integrator 212, and a second digital-to-analog converter 213.

The input port IN is used to receive an input signal.

The second digital-to-analog converter 213 is coupled between an output port of the quantizer 22 and a second feedback port of the first analog integrator 211 as well as a third feedback port of the second analog integrator 212, and is used to convert a digital code output by the quantizer 22 and provide a second feedback signal accordingly.

The first analog integrator 211 is coupled between the signal input port IN and an input port of the second analog integrator 212, and is used to receive the input signal and the second feedback signal and generate a first integrated signal accordingly.

The input port of the second analog integrator 212 is further coupled to the signal input port IN. The second analog integrator 212 is used to receive the input signal, the second feedback signal and the first integrated signal, and generate an internal signal accordingly.

In some embodiments of the present disclosure, the first analog integrator 211 includes a fourth capacitor, a fifth capacitor, a sixth capacitor, and a seventh capacitor. The fourth capacitor and the fifth capacitor are used to acquire the input signal and the second feedback signal and store a difference between the input signal and the second feedback signal. The sixth capacitor and the seventh capacitor are used to receive the difference between the input signal and the second feedback signal, and generate the first integrated signal accordingly. With above-mentioned four capacitors, the first-order noise shaping may be performed on the input signal and the signal fed back by the second digital-to-analog converter.

In some embodiments of the present disclosure, the second analog integrator 212 includes an eighth capacitor, a ninth capacitor, a tenth capacitor, an eleventh capacitor, a twelfth capacitor, and a thirteenth capacitor. The eighth capacitor and the ninth capacitor are used to acquire and store the first integrated signal. The tenth capacitor and the eleventh capacitor are used to acquire the input signal and the second feedback signal, and store a difference between the input signal and the second feedback signal. The twelfth capacitor and the thirteenth capacitor are used to receive the first integrated signal and the difference between the input signal and the second feedback signal, and generate the internal signal accordingly. With above-mentioned six capacitors, the first-order noise shaping may be performed on the input signal, the integrated signal output by the first analog integrator and the signal fed back by the second digital-to-analog converter.

In the embodiments of the present disclosure, a process of shaping quantization noise by the quantizer 22 after receiving the internal signal is the same as that described above, which will not be repeated here.

Figure 3:
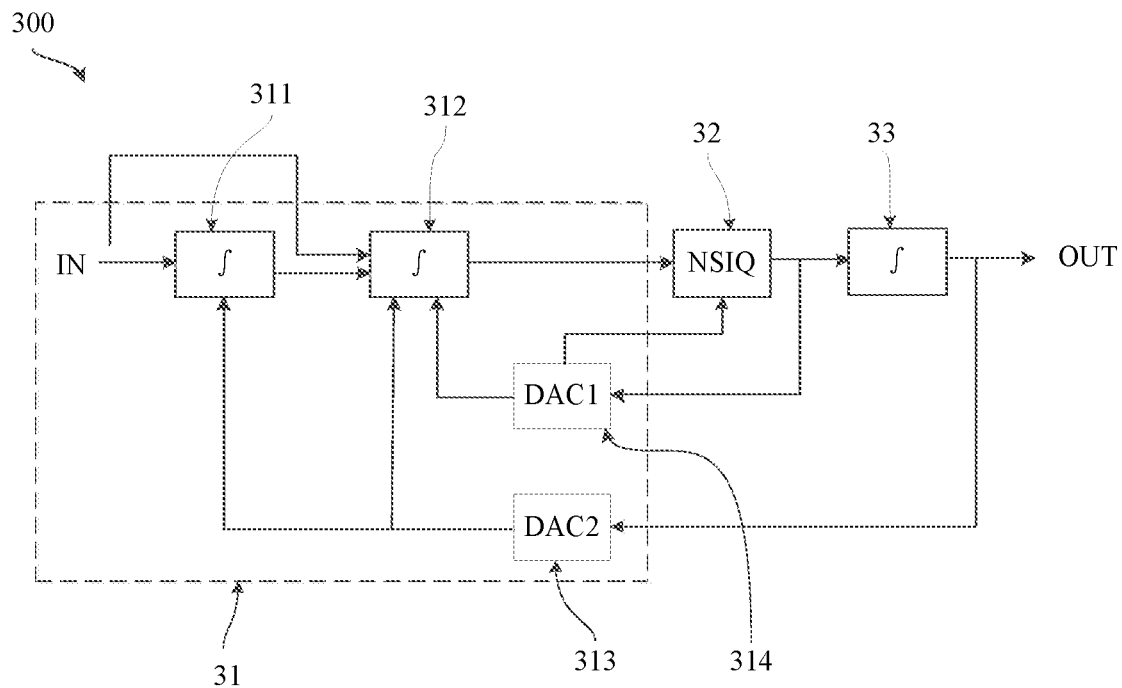
FIG. 3 shows a schematic structural diagram of a sigma-delta modulator according to the embodiments of the present disclosure.

FIG. 3 shows a schematic structural diagram of a sigma-delta modulator according to the embodiments of the present disclosure.

As shown in FIG. 3, the sigma-delta modulator includes a front part 31, a quantizer 32, a digital integrator 33, and a signal output port OUT. The quantizer 32 includes an integrator, an integrating capacitor, a passive low-pass filter, a comparator, and a first feedback port. The integrator, the integrating capacitor, the passive low-pass filter, the comparator and the first feedback port are the same as or similar to those described above in the structure and the operation process, which will not be repeated here.

The front part 31 includes a signal input port IN, a first analog integrator 311, a second analog integrator 312, a first digital-to-analog converter 314, and a second digital-to-analog converter 313.

The input port IN is used to receive an input signal.

The first digital-to-analog converter 314 is coupled between an output port of the quantizer 32 and a fourth feedback port of the second analog integrator 312, and is used to convert a digital code output by the quantizer 32 and provide a first feedback signal accordingly.

The second digital-to-analog converter 313 is coupled between an output port of the digital integrator 33 and a second feedback port of the first analog integrator 311 as well as a third feedback port of the second analog integrator 312, and is used to convert a digital code output by the digital integrator 33 and provide a second feedback signal accordingly.

The first analog integrator 311 is coupled between the signal input port IN and the input port of the second analog integrator 312, and is used to receive the input signal and the second feedback signal and generate a first integrated signal accordingly.

In some embodiments of the present disclosure, the first analog integrator 311 includes a fourth capacitor, a fifth capacitor, a sixth capacitor, and a seventh capacitor. The fourth capacitor and the fifth capacitor are used to acquire the input signal and the second feedback signal and store a difference between the input signal and the second feedback signal. The sixth capacitor and the seventh capacitor are used to receive the difference between the input signal and the second feedback signal and generate the first integrated signal accordingly.

The input port of the second analog integrator 312 is further coupled to the signal input port IN. The second analog integrator 312 is used to receive the input signal, the first integrated signal, the second feedback signal and the first feedback signal, and generate the internal signal accordingly.

In some embodiments of the present disclosure, the second analog integrator 312 includes an eighth capacitor, a ninth capacitor, a tenth capacitor, an eleventh capacitor, a twelfth capacitor, and a thirteenth capacitor. The eighth capacitor and the ninth capacitor are used to acquire the first integrated signal and the first feedback signal, and store a difference between the first integrated signal and the first feedback signal. The tenth capacitor and the eleventh capacitor are used to acquire the input signal and the second feedback signal, and store a difference between the input signal and the second feedback signal. The twelfth capacitor and the thirteenth capacitor are used to receive the difference between the first integrated signal and the first feedback signal and the difference between the input signal and the second feedback signal, and generate the internal signal accordingly.

In the embodiments of the present disclosure, a process of shaping quantization noise by the quantizer 32 after receiving the internal signal and the first feedback signal is the same as that described above, which will not be repeated here.

In the embodiments of the present disclosure, the digital integrator 33 is coupled to the output port of the quantizer 32, and is used to integrate the digital code output by the quantizer 32 so as to provide an integrated digital code.

The digital integrator is essentially equivalent to an adder, and may accumulate digital codes received, such as 3bit digital codes, to obtain, for example, 5bit digital codes, which are then transmitted to the signal output port OUT as a system output.

After providing a feedback path of the digital integrator 33 and the first digital-to-analog converter 314 in the sigma-delta modulator of the embodiments of the present disclosure, the input signal of the quantizer 32 becomes a difference between the output signal of the second analog integrator 312 in a current period and the output signal of the second analog integrator 312 in a previous period. Due to structural characteristics of the sigma-delta modulator, a sampling frequency is much higher than a bandwidth of the input signal, and a maximum value of an integration path signal difference may be much smaller than a maximum value of an integration path output signal. Therefore, after the feedback path of the digital integrator 33 and the first digital-to-analog converter 314 are provided, the stability of the sigma-delta modulator may be improved.

A principle that the quantizer in the embodiments of the present disclosure changes a loop transfer function of the sigma-delta modulator will be briefly described below.

For example, in the $K^{th}$ period (K is a positive integer greater than 1), suppose that the loop transfer function of the sigma-delta modulator is H'(z), the input signal of the sigma-delta modulator is X(z), and the filtered quantization error signal added to the sigma-delta modulator due to the effect of the quantizer is Q(z). In the embodiments of the present disclosure, because a two-stage integral negative feedback structure is adopted in an integration path, the loop transfer function of the sigma-delta modulator may satisfy Equation (3).

$$H'(z)=STF\cdot X(z)+(1-z^{-1})^2 Q(z) \qquad (3)$$

where STF indicates the signal transfer function, which is about 1 in this embodiment.

The quantization error signal for the $(K-1)^{th}$ period may be stored on the integrating capacitor, and may be filtered by the passive low-pass filter and then fed back to the input terminal of the quantizer. By superimposing the quantization error for the $(K-1)^{th}$ period and the quantization error for the $(K-2)^{th}$ period on the quantization error for the $K^{th}$ period, Equation (4) may be obtained.

$$Q(z)=(1-2z^{-1}+z^{-2})eq(z) \qquad (4)$$

where eq(z) indicates the quantization error for the $K^{th}$ period introduced after the quantization by the comparator.

If Q(z) is indicated by quantization noise, Equation (5) may be obtained.

$$H'(z)=STF\cdot X(z)+(1-z^{-1})^4 eq(z) \qquad (5)$$

According to Equation (5), the sigma-delta modulator in the embodiments of the present disclosure has performed a fourth-order noise shaping on the quantization noise. In addition, a passive low-pass filter structure is used in the quantizer of the sigma-delta modulator to feed back the quantization error signal acquired in the discharge period to the input terminal of the quantizer. Since the passive low-pass filter is composed of passive components and a sampling signal thereof is the output signal of the quantizer in the discharge period (that is, the quantization error signal), it does not consume additional energy. Therefore, the quantizer in the present disclosure may not cause a significant increase in the power consumption of the system while improving the noise shaping capability of the system. The passive low-pass filter consumes almost no energy and may be more energy-efficient when the sigma-delta modulator has the same quantization effective number of bits, so that the power consumption of the quantizer may be effectively reduced, and the power consumption of the sigma-delta modulator may be further reduced. In other words, the sigma-delta modulator in the embodiments of the present disclosure may perform the fourth-order noise shaping with low power consumption.

Figure 4:
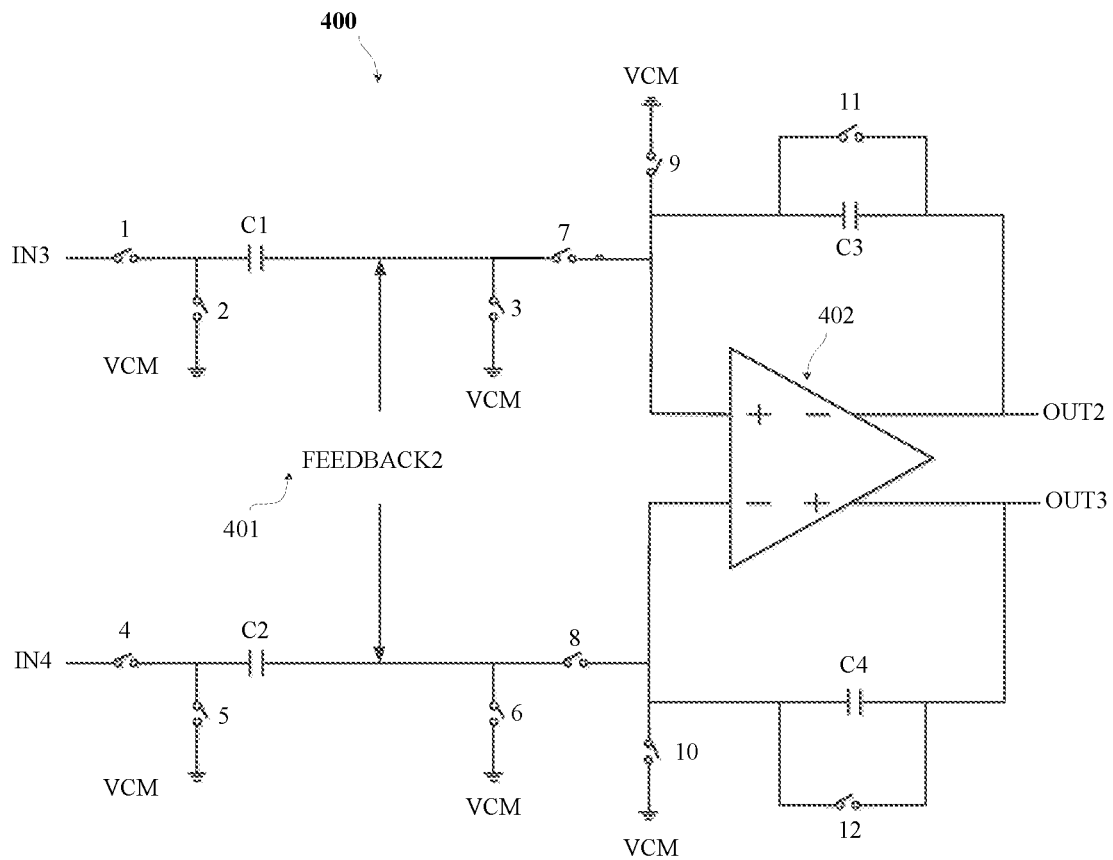
FIG. 4 shows a schematic diagram of a circuit structure of a first analog integrator according to the embodiments of the present disclosure.
Figure 5:
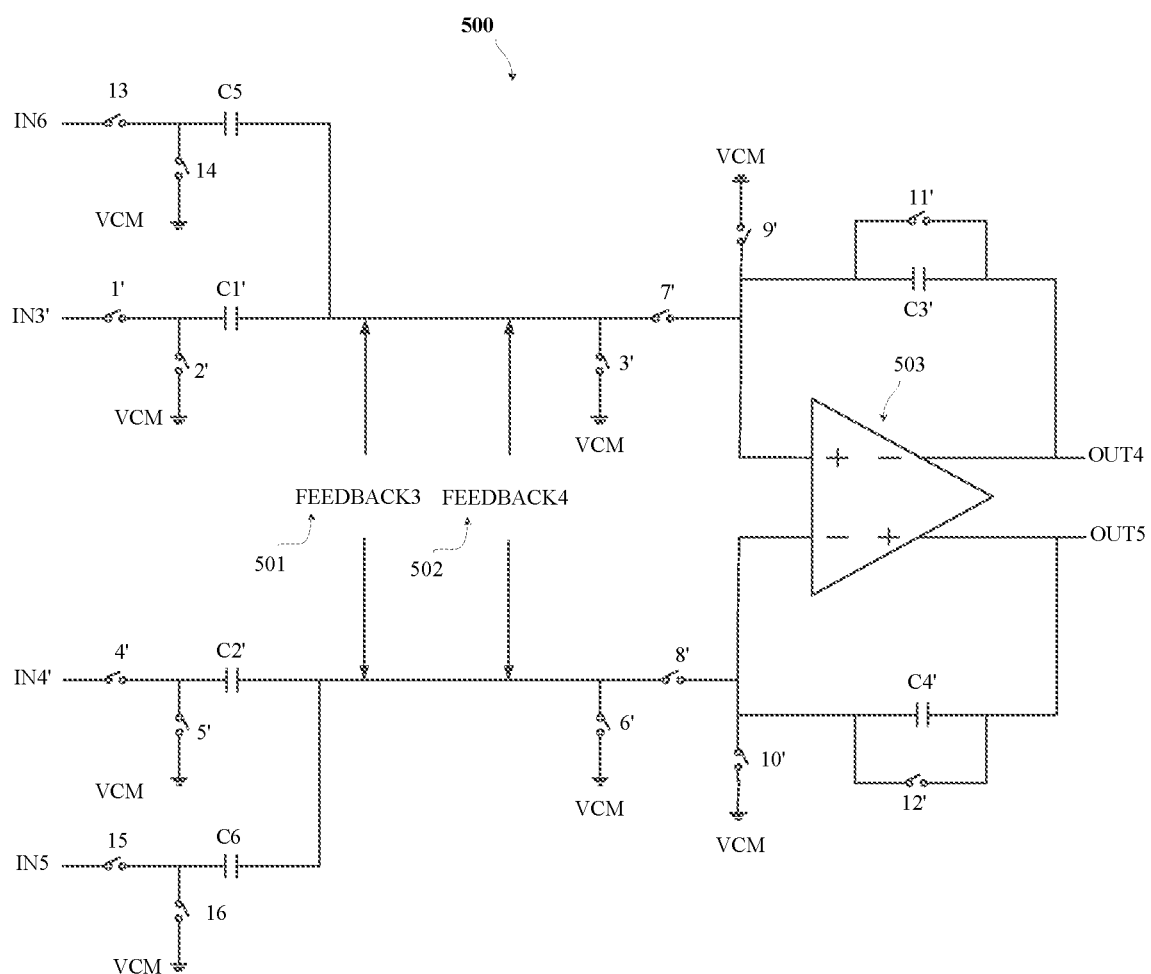
FIG. 5 shows a schematic diagram of a circuit structure of a second analog integrator according to the embodiments of the present disclosure.
Figure 6:
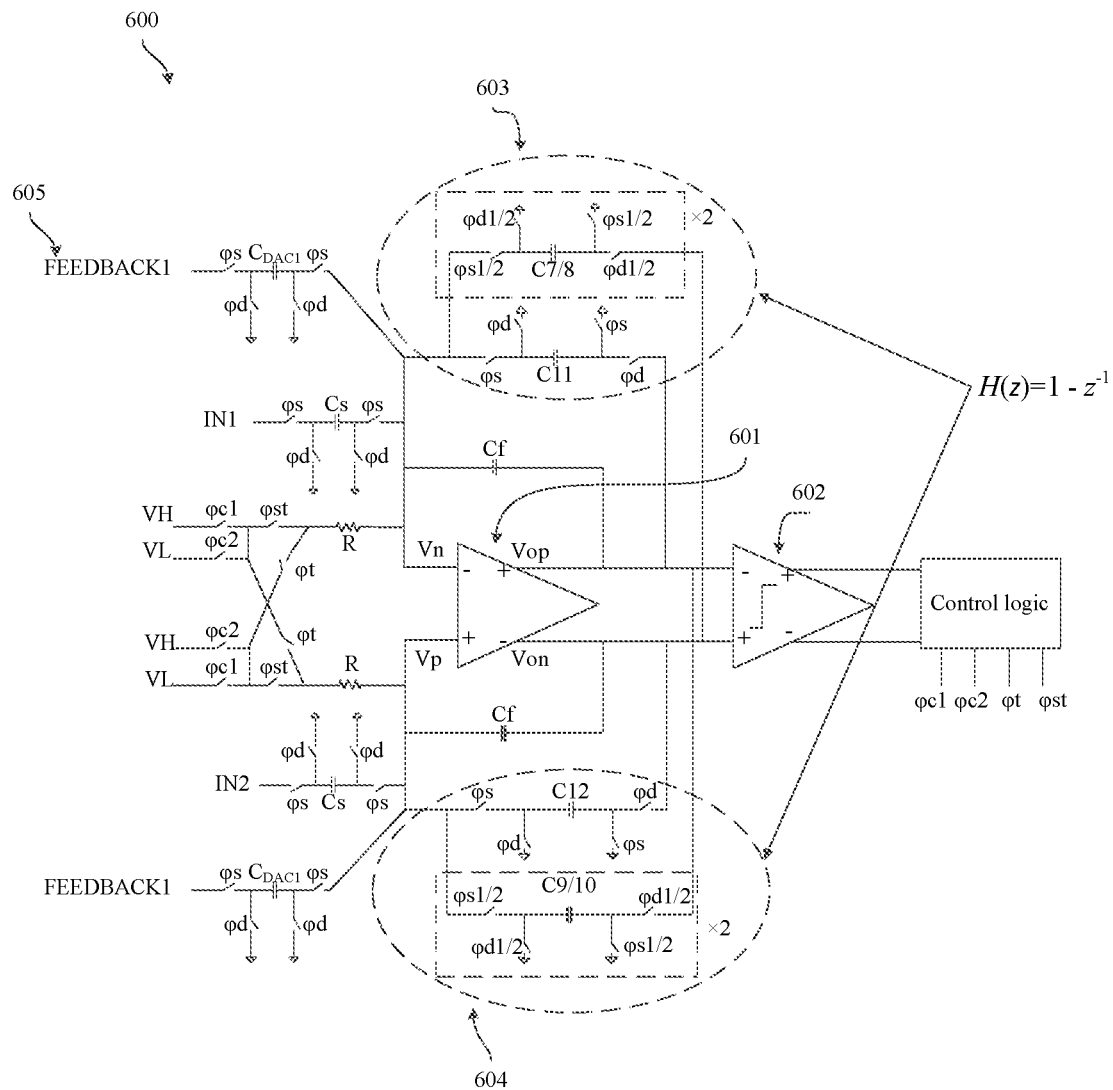
FIG. 6 shows a schematic diagram of a circuit structure of a quantizer for a sigma-delta modulator according to the embodiments of the present disclosure.
Figure 7:
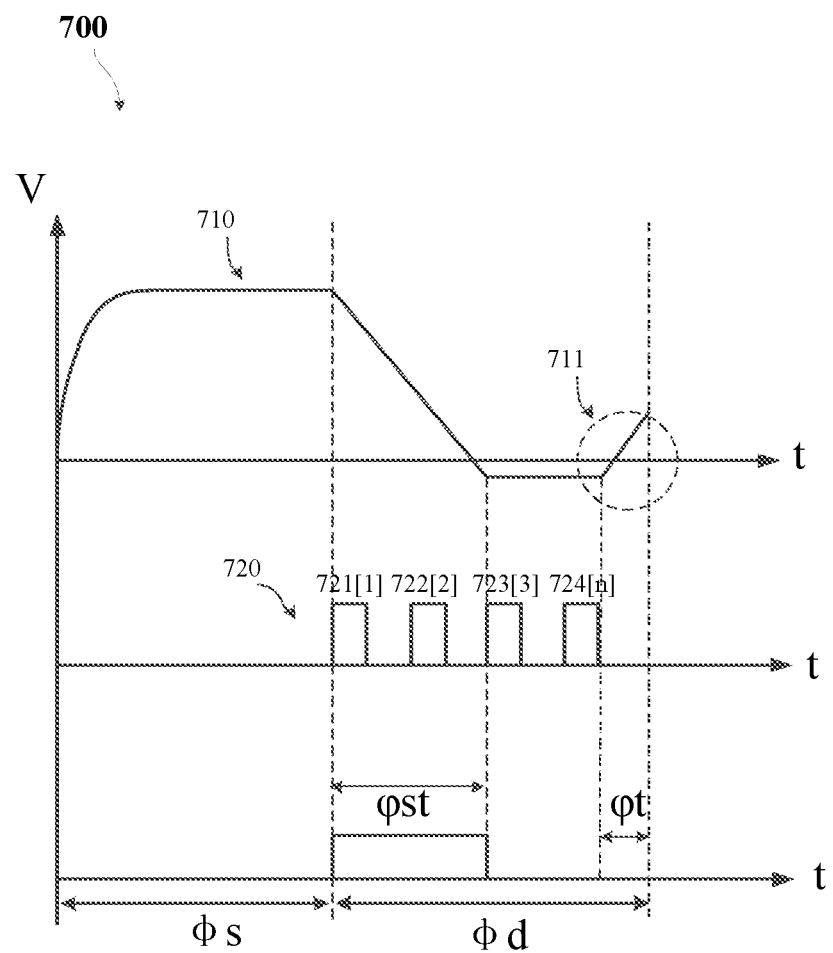
FIG. 7 shows an operation timing diagram of the quantizer circuit in FIG. 6 during a sampling period and a discharge period.
Figure 8:
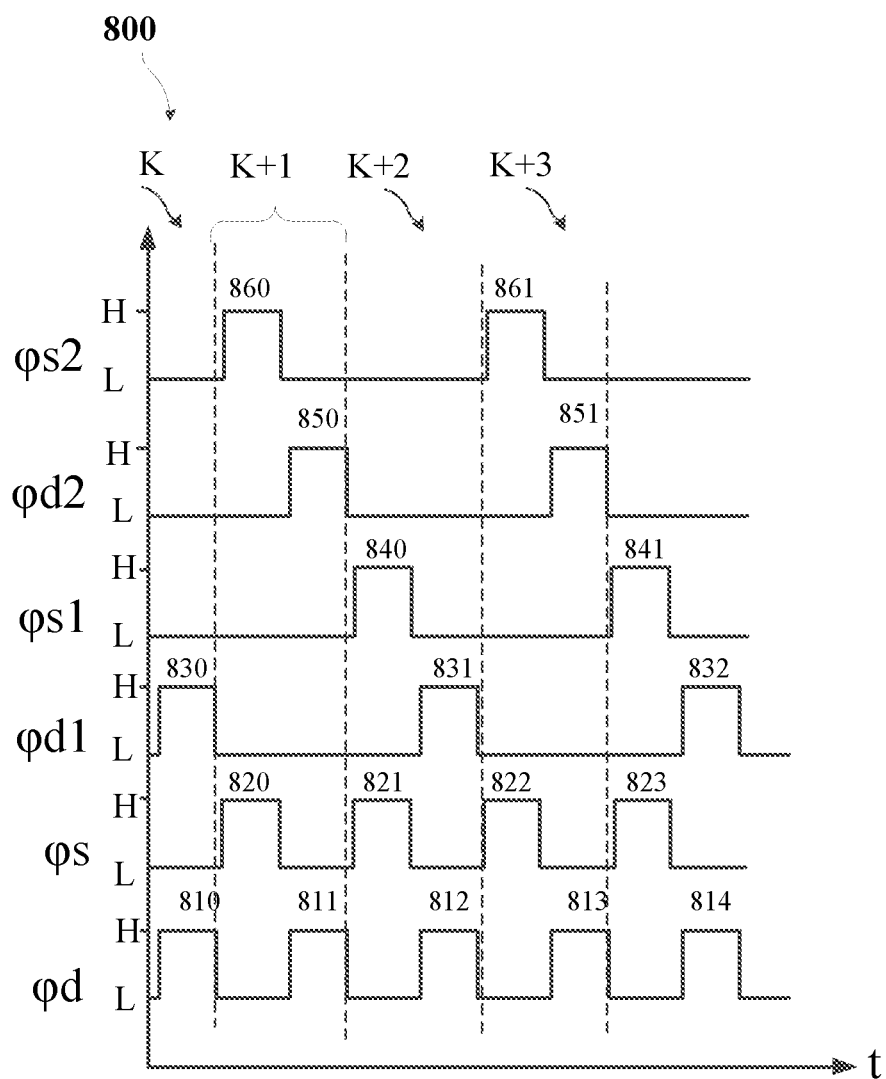
FIG. 8 shows an operation timing diagram of a passive low-pass filter in FIG. 6.

FIG. 4 and FIG. 5 respectively show a schematic diagram of a circuit structure of a first analog integrator and a schematic diagram of a circuit structure of a second analog integrator according to the embodiments of the present disclosure. FIG. 6 shows a schematic diagram of a circuit structure of a quantizer for a sigma-delta modulator according to the embodiments of the present disclosure. FIG. 7 shows an operation timing diagram of the quantizer circuit in FIG. 6 in the sampling period and the discharge period. FIG. 8 shows the operation timing diagram of the passive low-pass filter in FIG. 6. The specific operation process of the first analog integrator, the second analog integrator and the quantizer in FIG. 3 is described below in detail with reference to FIG. 4 to FIG. 8, where the structure of the sigma-delta modulator in FIG. 3 is illustrated by way of example.

It should be understood that the content shown in FIG. 4 to FIG. 8 is only used to help those skilled in the art to understand the technical solutions of the present disclosure, and is not used to limit the protection scope of the present disclosure.

As shown in FIG. 4, the first analog integrator 311 (shown in FIG. 3) includes signal input ports IN3 and IN4, signal output ports OUT2 and OUT3, a capacitor C1 (that is, the fourth capacitor), a capacitor C2 (that is, the fifth capacitor), a capacitor C3 (that is, the sixth capacitor), a capacitor C4 (that is, the seventh capacitor), a second feedback port 401, a fully differential operational amplifier 402, and switches 1~12.

An operation mode of the first analog integrator 311 includes a reset phase, a sampling phase, and an operation phase.

After the circuit is started, the first analog integrator 311 firstly enters the reset phase. At this time, switches 9, 10, 11 and 12 are closed, and the other switches are opened. The capacitor C3 and the capacitor C4 are reset until a charge on the capacitors is 0, so as to prevent a residual charge in previous signal processing from affecting the current signal processing. Generally, the first analog integrator 311 operates in the reset phase once during the signal processing, and then continuously operate cyclically in the sampling phase and the operation phase.

After the circuit is reset, the first analog integrator 311 enters the sampling phase. At this time, the switches 1, 3, 4 and 6 are closed, and the other switches are opened. A current input signal is input from the signal input ports IN3 and IN4, and the second feedback signal fed back by the second digital-to-analog converter 313 is input from the second feedback port 401. A voltage difference between the current input signal and the second feedback signal may be stored on the capacitors C1 and C2 (equivalent to performing a difference operation).

In the operation phase, the switches 2, 5, 7 and 8 are closed, and the other switches are opened. With the fully differential operational amplifier 402, the charge stored on the capacitors C1 and C2 may be transferred to the capacitors C3 and C4 according to the law of conservation of charge, so as to perform the first-order noise shaping. Then, the first integrated signal is output from the signal output ports OUT2 and OUT3.

For ease of description and understanding, a case that the capacitor C1 and the capacitor C2 have a same capacitance value and the capacitor C3 and the capacitor C4 have a same capacitance value is illustrated by way of example in describing a principle that the first analog integrator performs the first-order noise shaping.

In the sampling phase of the $N^{th}$ period, the current input signal is sampled and stored on the capacitors C1 and C2, and a total charge is recorded as $C_{1,2}V_{in}(N)$. In the operation phase of the $N^{th}$ period, a voltage signal transferred in the operation phase of the $(N-1)^{th}$ period is stored on the capacitors C3 and C4, and a total charge is recorded as $C_{3,4}V_{out}(N-1)$. The charge on the capacitors C1 and C2 becomes $C_{1,2}V_{in}(N-1)$ after a delay. In the operation phase of the $N^{th}$ period, according to the law of conservation of charge, the charge stored on the capacitor is transferred and redistributed. A charge transfer equation may be expressed as Equation (6).

$$C_{3,4}V_{out}(N)=C_{1,2}V_{in}(N-1)+C_{3,4}V_{out}(N-1) \quad (6)$$

After a z-transform, Equation (7) may be obtained.

$$C_{3,4}V_{out}(z)=C_{1,2}V_{in}(z)z^{-1}+C_{3,4}V_{out}(z)z^{-1} \quad (7)$$

After a simple transform, the transfer function of the first analog integrator may be obtained.

$$H_1(z) = \frac{V_{out}(z)}{V_{in}(z)} = \frac{C_{1,2}}{C_{3,4}} \frac{z^{-1}}{1-z^{-1}} \quad (8)$$

In this embodiment, a ratio of the capacitor C1 to the capacitor C3 may be set to 0.2~0.5. For example, if the ratio of the capacitor C1 to the capacitor C3 is set to 0.2, the input signal may be reduced to 0.2 times of the original value, and the first-order noise shaping may be performed on the input signal. It should be understood that the values shown above are only used to help those skilled in the art to understand the technical solutions of the present disclosure, and are not used to limit the protection scope of the present disclosure. In other embodiments, the ratio of the capacitor C1 to the capacitor C3 may be set according to actual needs so as to achieve different degrees of reduction or amplification of different input signals and perform the first-order noise shaping, which is not limited here.

As shown in FIG. 5, the second analog integrator 312 (shown in FIG. 3) includes signal input ports IN3' and IN4', signal output ports OUT4 and OUT5, a capacitor C1' (that is, the eighth capacitor), a capacitor C2' (that is, the ninth capacitor), a capacitor C3' (that is, the twelfth capacitor), a capacitor C4' (that is, the thirteenth capacitor), a capacitor C5 (that is, the tenth capacitor), a capacitor C6 (that is, the eleventh capacitor), a third feedback port 501, a fourth feedback port 502, a fully differential operational amplifier 503, and switches 1'~16.

The second analog integrator 312 is similar to the first analog integrator 311 in the operation mode and the operation principle, which will be briefly described here.

An operation mode of the second analog integrator 312 includes a reset phase, a sampling phase, and an operation phase.

After the circuit is started, the second analog integrator 312 firstly enters the reset phase. At this time, switches 9', 10', 11' and 12' are closed, and the other switches are opened. The capacitors C3' and C4' are reset until a charge on the capacitors is 0, so as to prevent a residual charge in the previous signal processing from affecting the current signal processing. Generally, the second analog integrator 312 operates in the reset phase once during the signal processing, and then continuously operate cyclically in the sampling phase and the operation phase.

After the circuit is reset, the second analog integrator 312 enters the sampling phase. At this time, the switches 1', 3', 4', 6', 13 and 15 are closed, and the other switches are opened. The first integrated signal output from the first analog integrator 311 is input from the signal input ports IN3' and IN4', and the first feedback signal fed back by the first digital-to-analog converter 314 is input from the third feedback port 501. The current input signal is input from the signal input ports IN5 and IN6, and the second feedback signal fed back by the second digital-to-analog converter 313 is input from the fourth feedback port 502. At this time, the capacitors C1' and C2' may store a voltage difference between the first integrated signal and the first feedback signal, and the capacitors C5 and C6 may store a voltage difference between the current input signal and the second feedback signal.

In the operation phase, the switches 2', 5', 7', 8', 14 and 16 are closed, and the other switches are opened. With the fully differential operational amplifier 503, the charge stored on the capacitors C1', C2', C5 and C6 may be transferred to the capacitors C3' and C4' according to the law of conservation of charge so as to perform the first-order noise shaping, and then the internal signal may be output from the output ports OUT4 and OUT5 to the quantizer 32.

An operation principle of the second analog integrator is similar to that of the first analog integrator. For ease of description and understanding, a case that the capacitor C1' and the capacitor C2' have a same capacitance value, the capacitor C3' and the capacitor C4' have a same capacitance value, and the capacitor C5 and the capacitor C6 have a same capacitance value is illustrated by way of example in describing a principle that the second analog integrator performs the first-order noise shaping.

In the sampling phase of the $N^{th}$ period, the difference between the first integrated signal and the first feedback signal is stored on the capacitors C1' and C2', and a total charge is recorded as $C_{1',2'}V_{out1}(N)$. The difference between the current input signal and the second feedback signal is stored on the capacitors C5 and C6, and a total charge is recorded as $C_{5,6}V_{in}(N)$. In the operation phase of the $N^{th}$ period, a voltage signal transferred in the operation phase of the $(N-1)^{th}$ period is stored on the capacitors C3' and C4', and a total charge is recorded as $C_{3',4'}V_{out}(N-1)$. The charge on the capacitors C1' and C2' becomes $C_{1',2'}V_{out1}(N-1)$ after a delay. The charge on the capacitors C5 and C6 becomes $C_{5,6}V_{in}(N-1)$ after a delay. In the operation phase of the $N^{th}$ period, according to the law of conservation of charge, the charge stored on the capacitor is transferred and redistributed. A charge transfer equation may be expressed as Equation (9).

$$C_{3',4'}V_{out}(N)=C_{1',2'}V_{out1}(N-1)+C_{5,6}V_{in}(N-1)+C_{3',4'}V_{out}(N-1) \quad (9)$$

After a z-transform, Equation (10) may be obtained.

$$C_{3',4'}V_{out}(z)=C_{1',2'}V_{out1}(z)z^{-1}+C_{5,6}V_{in}(z)z^{-1}+C_{3',4'}V_{out}(z)z^{-1} \quad (10)$$

In this embodiment, a ratio of the capacitor C1' to the capacitor C5 may be set to 0.4~0.6, for example, to 0.5. After a simple transform, a transfer function of the second analog integrator may be obtained.

$$H_2(z) = \frac{V_{out}(z)}{1/2 \cdot V_{out1}(z) + V_{in}(z)} = \frac{C_{5,6}}{C_{3',4'}} \frac{z^{-1}}{1-z^{-1}} \quad (11)$$

In this embodiment, for example, if the ratio of the capacitor C5 to the capacitor C3' is set to 0.5, the input signal may be reduced to 0.5 times of the original value, and the first-order noise shaping may be performed on the input signal. It should be understood that the values shown above are only used to help those skilled in the art to understand the technical solutions of the present disclosure, and are not used to limit the protection scope of the present disclosure. In other embodiments, the ratio of the capacitor C5 to the capacitor C1' and the ratio of the capacitor C5 to the capacitor C3' may be set according to actual needs, so as to achieve different degrees of reduction or amplification of different input signals and perform the first-order noise shaping, which is not limited here.

FIG. 6 shows a schematic diagram of a circuit structure of a quantizer for a sigma-delta modulator according to the embodiments of the present disclosure.

As shown in FIG. 6, the quantizer mainly includes signal input terminals IN1 and IN2, an integrator 601, a comparator 602, two integrating capacitors Cf, a first passive low-pass filter 603, a second passive low-pass filter 604, and a first feedback port 605. The first passive low-pass filter 603 and the second passive low-pass filter 604 have the same structure and operation principle. In this embodiment, the first passive low-pass filter 603 is illustrated by way of example in describing the operation process of the passive low-pass filter.

The first passive low-pass filter 603 includes capacitors C11, C7 and C8, and corresponding control switches. For example, φs1 and φd1 controls the capacitor C7, and φs2 and φd2 controls the capacitor C8 (a dotted part "×2" in FIG. 6 indicates that C7 and C8 have respective control circuits). The capacitor 11 is equivalent to the first capacitor, which is used to acquire the quantization error signal for the $K^{th}$ period in the $K^{th}$ discharge period, generate the filtered quantization error signal accordingly, and feed back the filtered quantization error signal to the integrator in the $(K+1)^{th}$ sampling period. The capacitors C7 and C8 are respectively equivalent to the second capacitor and the third capacitor, which are used to respectively acquire the quantization error signal for the odd-numbered period and the quantization error signal for the even-numbered period, generate the filtered quantization error signals accordingly, and feed back the filtered quantization error signals to the integrator in the $(K+2)^{th}$ sampling period.

FIG. 7 shows an operation timing diagram of the quantizer circuit in FIG. 6 during a sampling period and a discharge period. FIG. 8 shows an operation timing diagram of the passive low-pass filter in FIG. 6. The operation process of the circuit in FIG. 6 will be described in detail below in combination with FIG. 7 and FIG. 8.

An operation mode of the quantizer 32 includes a reset period, a sampling period, and a discharge period. The reset period of the quantizer is similar to the reset phase of the first analog integrator 311, which is mainly used to remove the residual charge on the capacitor, so as to prevent the residual charge in the previous signal processing from affecting the current signal processing. Generally, the quantizer 32 operates in the reset period only once during the signal processing, and then continuously operates cyclically in the sampling period and the discharge period (timing signals φs and φd shown in FIG. 7 indicate the sampling period and the discharge period, respectively).

In the $K^{th}$ sampling period φs, the internal signal may be input from the signal input ports IN1 and IN2. At the same time, the first feedback signal fed back by the first digital-to-analog converter 314 may be input from the first feedback port 605. In addition, the passive low-pass filter (including the first passive low-pass filter 603 and the second passive low-pass filter 604) with a transfer function of $(1-z^{-1})$ may feed back the filtered quantization error signal for the $(K-1)^{th}$ period (for example, the filtered quantization error signal for the $(K-1)^{th}$ period fed back by the capacitors C11 and C12), the filtered quantization error signal for the $(K-2)^{th}$ period (for example, the filtered quantization error signal for the $(K-2)^{th}$ period fed back by the capacitors C7 and C9) to the input terminal of the quantizer. After superimposed on the capacitor Cs, these signals may be integrated by the integrator 601 and superimposed with the quantization error signal for the $(K-1)^{th}$ period stored on the capacitor Cf to generate the quantization error signal for the $K^{th}$ period. The quantization error signal for the $K^{th}$ period may be stored on the capacitor Cf. A curve 710 shown in FIG. 7 indicates an output voltage Vout (Vout=Vop−Von) of the integrating capacitor Cf. As shown in FIG. 7, during the sampling period φs, the quantization error signal for the $K^{th}$ period may be stored on the integrating capacitor Cf.

In the $K^{th}$ discharge period φd, the comparator 602 may quantize the quantization error signal for the $K^{th}$ period. A discharge direction may be determined by the comparator 602, φc1 or φc2 is turned on, and φst is set to 1 (shown in FIG. 6). At this time, the integrating capacitor Cf starts to discharge.

An operation period of the comparator 602 is shown as a square wave 720 in FIG. 7. The comparator 602 performs multiple comparisons in the discharge period. During this phase, the comparator 602 is in an operating state alternately, and each pulse of pulses 721[1], 722[2], 723[3] and 724[n] causes the comparator 602 to quantize the input signal and generate a digital code.

As shown in FIG. 7, during the discharging process of the integrating capacitor Cf (φst shown in FIG. 7 indicates the discharge time of the integrating capacitor Cf), an absolute value of the output voltage Vout of the integrating capacitor Cf may gradually decrease (a curve 710 shown in FIG. 7). When the comparator 602 detects that a magnitude relationship between Vop and Von is reversed, the discharge ends, and φst is set to 0. Then, the quantization process ends. A number of comparison periods prior to the reversal detected by the comparator 602 is taken as an output result of the quantizer. Then, the error is quantized, and the digital code is output. In a last half of the comparison period of the clock of the comparator 602 (φt phase shown in FIG. 7), the integrating capacitor Cf is recharged for half the comparison period (a process 711 shown in FIG. 7), so that the quantization error signal on the capacitor Cf is reduced to half of the original value.

Operation timing of the first passive low-pass filter 603 is shown in FIG. 8. In FIG. 8, φd and φs respectively indicate operation timings of the switches φd and φs corresponding to the capacitor C11 in FIG. 6, φd1 and φs1 respectively indicate operation timings of the switches φd1 and φs1 corresponding to the capacitor C7, and φd2 and φs2 respectively indicate operation timings of the switches φd2 and φs2 corresponding to the capacitor C8.

As shown in FIG. 8, in the $K^{th}$ discharge period, φd and φd1 are controlled to be closed (pulse signals 810 and 830 shown in FIG. 8), and the other switches are opened. At this time, the capacitors C11 and C7 may acquire and keep the quantization error signal for the $K^{th}$ period on the integrating capacitor Cf.

In the $(K+1)^{th}$ sampling period, φs and φs2 are controlled to be closed (pulse signals 820 and 860 as shown in FIG. 8), and the other switches are opened. The quantization error signal for the $K^{th}$ period stored on the capacitor C11 is fed back to the input terminal of the quantizer, and the quantization error signal for the $(K-1)^{th}$ period stored on the capacitor C8 is fed back to the input terminal of the quantizer (that is, the quantization error signal stored on the capacitor C8 is fed back to the input terminal of the quantizer after a period of delay).

In the $(K+1)^{th}$ discharge period, φd and φd2 are controlled to be closed (pulse signals 811 and 850 shown in FIG. 8), and the other switches are opened. At this time, the capacitors C11 and C8 acquire and keep the quantization error signal for the $(K+1)^{th}$ period on the integrating capacitor Cf.

In the $(K+2)^{th}$ sampling period, φs and φs1 are controlled to be closed (pulse signals 821 and 840 as shown in FIG. 8), and the other switches are opened. The quantization error signal for the $(K+1)^{th}$ period stored on the capacitor C11 is fed back to the input terminal of the quantizer, and the quantization error signal for the $K^{th}$ period stored on the capacitor C7 is fed back to the input terminal of the quantizer (that is, the quantization error signal stored on the capacitor C7 is fed back to the input terminal of the quantizer after a period of delay).

In the embodiments of the present disclosure, the capacitor C11 in the passive low-pass filter may feed back the quantization error signal acquired directly to the input terminal of the quantizer in the next sampling period, and the capacitors C7 and C8 operate alternately, so that the quantization error signal acquired is fed back to the input terminal of the quantizer after a period of delay. Through the above method, a passive low-pass filter with a transfer function of $(1-z^{-1})$ may be formed.

With the passive low-pass filter structure described above, the quantizer in the embodiments of the present disclosure may feed back the quantization error signal acquired in the discharge period to the input terminal of the quantizer, so as to perform the second-order noise shaping. Since the passive low-pass filter is composed of passive components and a sampling signal thereof is the output signal of the quantizer in the discharge period (that is, the quantization error signal), it does not consume additional energy. Therefore, the quantizer in the present disclosure may not cause a significant increase in the power consumption of the system while improving the noise shaping capability of the system. The passive low-pass filter consumes almost no energy and may be more energy-efficient when the sigma-delta modulator has the same quantization effective number of bits, so that the power consumption of the quantizer may be effectively reduced, and the power consumption of the sigma-delta modulator may be further reduced.

FIG. 9 shows a flowchart of a method of shaping noise according to the embodiments of the present disclosure.

As shown in FIG. 9, the method of shaping noise includes operation S910 to operation S930.

In the operation S910, in a $K^{th}$ sampling period, an internal signal, a quantization error signal for a $(K-1)^{th}$ period stored on an integrating capacitor, a filtered quantization error signal for the $(K-1)^{th}$ period fed back by a passive low-pass filter, and a filtered quantization error signal for a $(K-2)^{th}$ period fed back by the passive low-pass filter are acquired by an integrator, and a quantization error signal for a $K^{th}$ period is generated accordingly. The quantization error signal for the $K^{th}$ period is stored on the integrating capacitor, so as to weight the internal signal in a $(K+1)^{th}$ sampling period, where K is a positive integer greater than 1.

In the operation S920, in a $K^{th}$ discharge period, the quantization error signal for the $K^{th}$ period is acquired by the passive low-pass filter, and a filtered quantization error signal is generated accordingly, so as to feed back the filtered quantization error signal to the integrator in a $(K+1)^{th}$ sampling period and a $(K+2)^{th}$ sampling period.

In the operation S930, the quantization error signal for the $K^{th}$ period is quantized by a comparator, so as to output a digital code.

In some embodiments of the present disclosure, the operation S920 of acquiring the quantization error signal for the $K^{th}$ period by the passive low-pass filter, and generating a filtered quantization error signal accordingly, so as to feed back the filtered quantization error signal to the integrator in a $(K+1)^{th}$ sampling period and a $(K+2)^{th}$ sampling period may further include operation S921 to operation S922.

In the operation S921, the quantization error signal for the $K^{th}$ period is acquired by using a first capacitor, and the filtered quantization error signal is generated accordingly and fed back to the integrator in the $(K+1)^{th}$ sampling period.

In the operation S922, a quantization error signal for an odd-numbered period and a quantization error signal for an even-numbered period are acquired respectively by a second capacitor and a third capacitor, and the filtered quantization error signals are generated accordingly and fed back to the integrator in the $(K+2)^{th}$ sampling period.

The embodiments of the present disclosure have been described above. However, these embodiments are for illustrative purposes only, and are not intended to limit the scope of the present disclosure. Although the embodiments have been described separately above, this does not mean that measures in the respective embodiments cannot be used in combination advantageously. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:
1. A quantizer for a sigma-delta modulator, comprising:
an integrator configured to generate, in a $K^{th}$ sampling period, a quantization error signal for a $K^{th}$ period according to an internal signal, a quantization error signal for a $(K-1)^{th}$ period, a filtered quantization error signal for the $(K-1)^{th}$ period, and a filtered quantization error signal for a $(K-2)^{th}$ period, wherein K is a positive integer greater than 1;

an integrating capacitor configured to store the quantization error signal for the $K^{th}$ period, so as to weight the internal signal in a $(K+1)^{th}$ sampling period;

a passive low-pass filter configured to acquire the quantization error signal for the $K^{th}$ period in a $K^{th}$ discharge period, generate a filtered quantization error signal according to the quantization error signal, and feedback the filtered quantization error signal to the integrator in a $(K+1)^{th}$ sampling period and a $(K+2)^{th}$ sampling period; and a comparator configured to quantize the quantization error signal for the $K^{th}$ period in the $K^{th}$ discharge period, so as to output a digital code.

2. The quantizer for the sigma-delta modulator according to claim 1, wherein the passive low-pass filter comprises: a first passive low-pass filter coupled to a positive phase input port and a positive phase output port of the integrator; and a second passive low-pass filter coupled to a negative phase input port and a negative phase output port of the integrator; and wherein each of the first passive low-pass filter and the second passive low-pass filter comprises:

a first capacitor configured to acquire the quantization error signal for the $K^{th}$ period in the $K^{th}$ discharge period, generate the filtered quantization error signal according to the quantization error signal, and feedback the filtered quantization error signal to the integrator in the $(K+1)^{th}$ sampling period; and a second capacitor and a third capacitor configured to respectively acquire a quantization error signal for an odd-numbered period and a quantization error signal for an even-numbered period, generate the filtered quantization error signals according to the quantization error signal for the odd-numbered period and the quantization error signal for the even-numbered period, and feedback the filtered quantization error signals to the integrator in the $(K+2)^{th}$ sampling period.

3. A sigma-delta modulator, comprising:
the quantizer according to claim 2; and
a front part comprising a front input port for receiving an input signal and a front output port for outputting an internal signal, wherein the front part is configured to generate the internal signal according to the input signal.

4. A sigma-delta modulator, comprising:
the quantizer according to claim 1; and
a front part comprising a front input port for receiving an input signal and a front output port for outputting an internal signal, wherein the front part is configured to generate the internal signal according to the input signal.

5. The sigma-delta modulator according to claim 4, wherein:
the front part further comprises a first digital-to-analog converter configured to convert the digital code output by the quantizer and provide a first feedback signal according to the digital code;
the quantizer further comprises a first feedback port coupled to a positive input port of the integrator, a negative input port of the integrator, and an output port of the first digital-to-analog converter, and configured to receive the first feedback signal; and the integrator is further configured to integrate the internal signal according to the first feedback signal.

6. The sigma-delta modulator according to claim 5, further comprising:
a digital integrator coupled to the output port of the quantizer, and configured to integrate the digital code output by the quantizer so as to provide an integrated digital code.

7. The sigma-delta modulator according to claim 6, wherein:
the front part comprises a first analog integrator, a second analog integrator, and a second digital-to-analog converter,
the second digital-to-analog converter is coupled between an output port of the digital integrator and a second feedback port of the first analog integrator as well as a third feedback port of the second analog integrator, and is configured to convert the digital code output by the digital integrator and provide a second feedback signal according to the digital code;
the first analog integrator is configured to receive the input signal and the second feedback signal, and generate a first integrated signal according to the input signal and the second feedback signal; and
the second analog integrator further comprises a fourth feedback port coupled to an output port of the first digital-to-analog converter and configured to receive the first feedback signal, and the second analog integrator is further configured to generate the internal signal according to the input signal, the first integrated signal, the second feedback signal, and the first feedback signal.

8. The sigma-delta modulator according to claim 7, wherein the second analog integrator comprises:
an eighth capacitor and a ninth capacitor configured to acquire the first integrated signal and the first feedback signal, and store a difference between the first integrated signal and the first feedback signal;
a tenth capacitor and an eleventh capacitor configured to acquire the input signal and the second feedback signal, and store a difference between the input signal and the second feedback signal; and
a twelfth capacitor and a thirteenth capacitor configured to receive the difference between the first integrated signal and the first feedback signal and the difference between the input signal and the second feedback signal, and generate the internal signal accordingly.

9. The sigma-delta modulator according to claim 7, wherein the first analog integrator comprises:
a fourth capacitor and a fifth capacitor configured to acquire the input signal and the second feedback signal, and store a difference between the input signal and the second feedback signal; and
a sixth capacitor and a seventh capacitor configured to receive the difference between the input signal and the second feedback signal, and generate the first integrated signal according to the difference between the input signal and the second feedback signal.

10. The sigma-delta modulator according to claim 4, wherein:
the front part comprises a first analog integrator, a second analog integrator, and a second digital-to-analog converter,
wherein the second digital-to-analog converter is coupled between an output port of the quantizer and a second feedback port of the first analog integrator as well as a third feedback port of the second analog integrator, and is configured to convert the digital code output by the quantizer and provide a second feedback signal according to the digital code;

the first analog integrator is configured to receive the input signal and the second feedback signal, and generate a first integrated signal according to the input signal and the second feedback signal; and the second analog integrator is configured to receive the input signal, the second feedback signal and the first integrated signal, and generate the internal signal according to the input signal, the second feedback signal and the first integrated signal.

11. The sigma-delta modulator according to claim 10, wherein the first analog integrator comprises:

a fourth capacitor and a fifth capacitor configured to acquire the input signal and the second feedback signal, and store a difference between the input signal and the second feedback signal; and a sixth capacitor and a seventh capacitor configured to receive the difference between the input signal and the second feedback signal, and generate the first integrated signal according to the difference between the input signal and the second feedback signal.

12. The sigma-delta modulator according to claim 10, wherein the second analog integrator comprises:

an eighth capacitor and a ninth capacitor configured to acquire and store the first integrated signal;

a tenth capacitor and an eleventh capacitor configured to acquire the input signal and the second feedback signal, and store a difference between the input signal and the second feedback signal; and a twelfth capacitor and a thirteenth capacitor configured to receive the first integrated signal and the difference between the input signal and the second feedback signal, and generate the internal signal according to the first integrated signal and the difference between the input signal and the second feedback signal.

13. A method of shaping noise, comprising:

acquiring, by using an integrator in a $K^{th}$ sampling period, an internal signal, a quantization error signal for a $(K-1)^{th}$ period stored on an integrating capacitor, a filtered quantization error signal for the $(K-1)^{th}$ period fed back by a passive low-pass filter, and a filtered quantization error signal for a $(K-2)^{th}$ period fed back by the passive low-pass filter, and generating a quantization error signal for a $K^{th}$ period accordingly, wherein the quantization error signal for the $K^{th}$ period is stored on the integrating capacitor, so as to weight the internal signal in a $(K+1)^{th}$ sampling period, wherein K is a positive integer greater than 1;

acquiring, by using the passive low-pass filter in a $K^{th}$ discharge period, the quantization error signal for the $K^{th}$ period, and generating a filtered quantization error signal according to the quantization error signal, so as to feed back the filtered quantization error signal to the integrator in a $(K+1)^{th}$ sampling period and a $(K+2)^{th}$ sampling period; and quantizing the quantization error signal for the $K^{th}$ period by using a comparator, so as to output a digital code.

14. The method according to claim 13, wherein the acquiring, by using the passive low-pass filter in a $K^{th}$ discharge period, the quantization error signal for the $K^{th}$ period, and generating a filtered quantization error signal according to the quantization error signal, so as to feed back the filtered quantization error signal to the integrator in a $(K+1)^{th}$ sampling period and a $(K+2)^{th}$ sampling period comprises:

acquiring the quantization error signal for the $K^{th}$ period by using a first capacitor, generating a filtered quantization error signal according to the quantization error signal, and feeding back the filtered quantization error signal to the integrator in the $(K+1)^{th}$ sampling period; and acquiring a quantization error signal for an odd-numbered period and a quantization error signal for an even-numbered period respectively by a second capacitor and a third capacitor, generating filtered quantization error signals according to the quantization error signal for the odd-numbered period and the quantization error signal for the even-numbered period, and feeding back the filtered quantization error signals to the integrator in the $(K+2)^{th}$ sampling period.

* * * * *